(12) United States Patent
Chiang et al.

(10) Patent No.: US 10,912,219 B2
(45) Date of Patent: Feb. 2, 2021

(54) WATERPROOF STRUCTURE

(71) Applicant: PEGATRON CORPORATION, Taipei (TW)

(72) Inventors: Tsung-Han Chiang, Taipei (TW); Jiun-Wei Li, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 125 days.

(21) Appl. No.: 16/408,594

(22) Filed: May 10, 2019

(65) Prior Publication Data

US 2019/0373751 A1 Dec. 5, 2019

(30) Foreign Application Priority Data

Jun. 1, 2018 (TW) .............................. 107119042 A (51) Int. Cl.
*H05K 5/06* (2006.01)
*H05K 5/02* (2006.01)
*H04R 1/02* (2006.01)

(52) U.S. Cl.
CPC ............ *H05K 5/069* (2013.01); *H05K 5/0247* (2013.01); *H05K 5/061* (2013.01); *H04R 1/02* (2013.01)

(58) Field of Classification Search
CPC ...... H05K 5/069; H05K 5/0247; H05K 5/061; H02G 3/083; H02G 3/088; H02G 3/14
See application file for complete search history.

(56) References Cited

U.S. PATENT DOCUMENTS

| 6,108,202 A * | 8/2000 | Sumida .................. H05K 7/026 361/690 |
| 2019/0120380 A1* | 4/2019 | Kempeneers .......... H02G 3/088 |
| 2020/0052472 A1* | 2/2020 | Goto ..................... H01B 17/301 |
| 2020/0194927 A1* | 6/2020 | Ledieu ................... H05K 5/069 |
| 2020/0315050 A1* | 10/2020 | Lee ...................... H05K 5/0247 |

FOREIGN PATENT DOCUMENTS

| CN | 105805479 A | 7/2016 |
| TW | M384940 U1 | 7/2010 |
| TW | 201037202 A1 | 10/2010 |

* cited by examiner

*Primary Examiner* — Timothy J Thompson
*Assistant Examiner* — Amol H Patel
(74) *Attorney, Agent, or Firm* — McClure, Qualey & Rodack, LLP (57) ABSTRACT

A waterproof structure includes a case, an elastic waterproof component and a cover. The case has a recess. The elastic waterproof component is disposed in the recess, includes a body, a first and a second inclined portions. The body includes a top surface, a bottom surface, a first, a second, a third and a fourth side surfaces, and a through hole, wherein the second and the fourth side surface are opposite to the first and the third side surface, respectively, and the through hole penetrates the body from the first side surface to the second surface. The first and the second inclined portion respectively extend from the third and the fourth side surface, and have top surface interconnects a first and a second inclined surface. The cover has a protrusion portion corresponding to the recess, and is assemble to the case and coves the elastic waterproof component.

12 Claims, 10 Drawing Sheets

WATERPROOF STRUCTURE

CROSS-REFERENCE TO RELATED APPLICATION

This application claims priority to Taiwan Application Serial Number 107119042, filed Jun. 1, 2018, which is herein incorporated by reference.

BACKGROUND

Technology Field

The present disclosure relates to a waterproof structure, in particular to a waterproof structure with an elastic waterproof component.

Description of Related Art

The electronic devices are typically connected to electronic components or various interfaces by various cables. For example, a cable is arranged passing through a hole on the case between the speaker and the circuit board to interconnect thereof. However, liquid may enter the circuit board from a gap between the cable and the hole, resulting in the damage of the circuit board.

Therefore, in order to achieve the effect of waterproof and dustproof, after the cable is deposed passing through the hole, the cable is covered with rubber and fitted into the hole, and further the gap between the hole and the rubber is coated with a waterproof adhesive. However, the manufacturing method of the waterproof structure described above is not only high cost and time consuming, but also inconvenient for maintenance. Accordingly, there is a demand for a novel waterproof structure.

SUMMARY

In accordance with various embodiments of the present disclosure, a waterproof structure is provided. The waterproof structure includes a case, an elastic waterproof component, and a cover. The case has a recess defined thereon. The elastic waterproof component is disposed in the recess. The elastic waterproof component includes a body, a first inclined portion and a second inclined portion. The body includes a top surface, a bottom surface, a first side surface, a second side surface, a third side surface, and a fourth side surface, the body has a through hole defined thereon, wherein the second side surface is opposite to the first side surface, the fourth side surface is opposite to the third side surface, and the through hole penetrates the body from the first side surface to the second side surface, and is configured to accommodate the cable for passing there through. The first inclined portion and the second inclined portion extends from the third side surface and the fourth side surface respectively, wherein the first inclined portion has a first inclined surface, the second inclined portion has a second inclined surface, and the top surface interconnects the first inclined surface with the second inclined surface. The cover has a protrusion portion corresponding to the recess, the cover is assembled to the case and covers the elastic waterproof component, wherein the protrusion portion presses against the top surface, the first inclined surface and the second inclined surface, so that the case, the elastic waterproof component and the cover are jointed closely.

According to some embodiments of the present disclosure, the case comprises a first sidewall, a second sidewall, the case further defines a first region, a second region, and a channel, wherein the first sidewall is adjacent to the first region, the second sidewall is adjacent to the second region, and the channel connects the first region with the second region.

According to some embodiments of the present disclosure, the body further includes a slit extending from the bottom surface of the elastic waterproof component to the through hole.

According to some embodiments of the present disclosure, the waterproof structure further includes a waterproof adhesive covering an edge of the through hole and the slit exposed to the first side surface.

According to some embodiments of the present disclosure, the elastic waterproof component comprises rubber or silicone.

According to some embodiments of the present disclosure, the elastic waterproof component has a Shore scleroscope hardness of about 45-55.

According to some embodiments of the present disclosure, the first inclined portion and the second inclined portion have a width that is greater than a width of the recess.

In accordance with various embodiments of the present disclosure, a first interference between the elastic waterproof component and the case is different from a second interference between the elastic waterproof component and the protrusion portion of the cover.

According to some embodiments of the present disclosure, the first interference is about 0.1 mm to about 0.2 mm.

According to some embodiments of the present disclosure, the second interference is about 0.4 mm to about 0.8 mm.

According to some embodiments of the present disclosure, the case and the cover comprises plastic or metal alloy.

According to some embodiments of the present disclosure, the protrusion portion of the cover has a bottom surface in contact with the elastic waterproof component, and the bottom surface is conformal to the top surface, the first inclined surface and the second inclined surface of the elastic waterproof component.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

Figure 1:
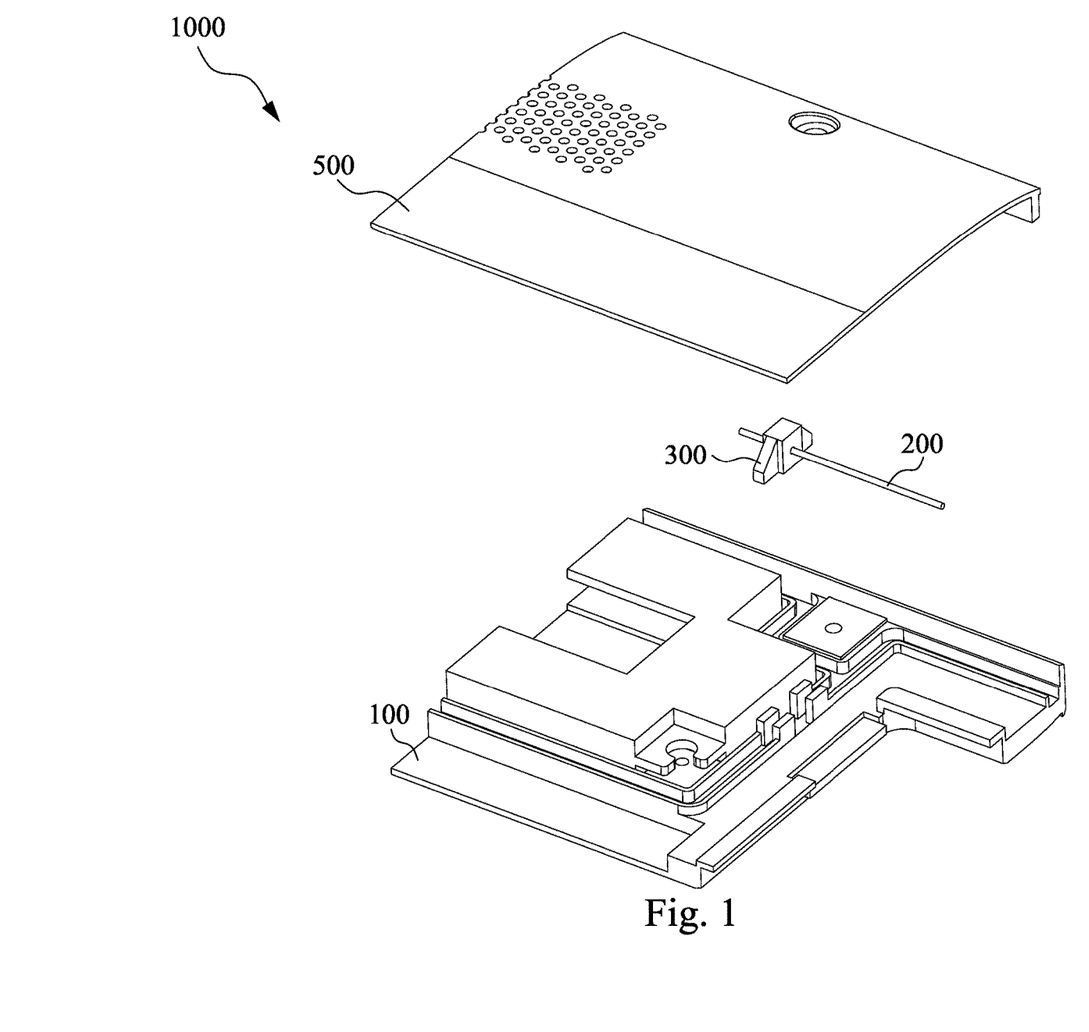
FIG. 1 is an explosion diagram of a waterproof structure in accordance with various embodiments of this invention.

FIG. 1 is an explosion diagram of a waterproof structure 1000 in accordance with various embodiments of this invention. The waterproof structure 1000 includes a case 100, a cable 200, an elastic waterproof component 300, and a cover 500. The waterproof structure 1000 may optionally include other elements, which are described hereinafter.

Figure 2:
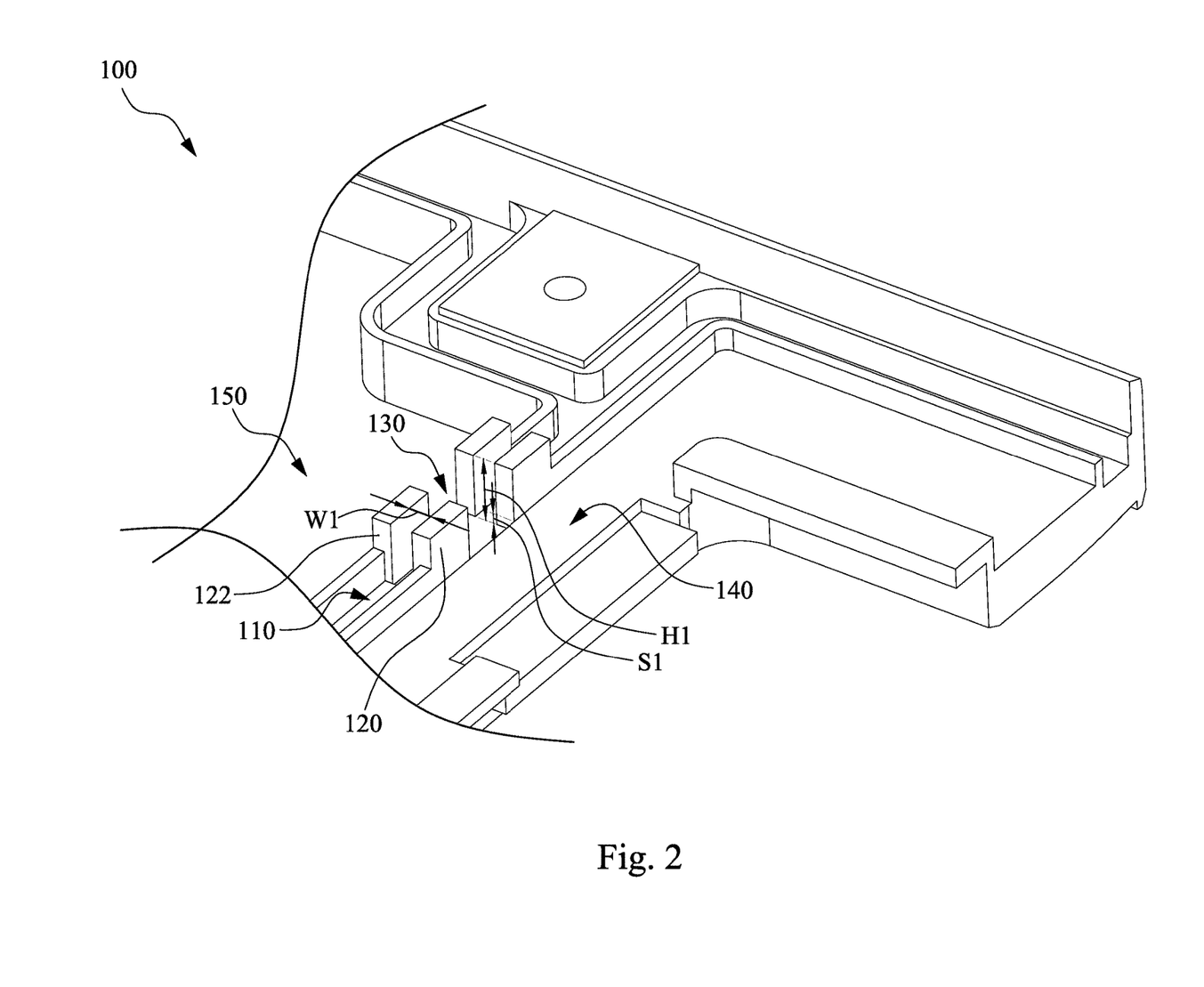
FIG. 2 is an enlarged perspective view of a case in accordance with various embodiments of this invention.

FIG. 2 is an enlarged perspective view of a case 100 in accordance with various embodiments of this invention. Please refer to FIG. 1 and FIG. 2, the case 100 include a recess 110 defined thereon. In various embodiments, the case 100 includes, but is not limited to plastic or metal alloy. In some embodiments, the case 100 includes magnesium alloy AZ91. In some embodiments, the recess 110 separates the first region 140 and the second region 150. In some embodiments, a motherboard or other electronic components may be disposed in the first region 140, but is not limited thereto. In some embodiments, a loudspeaker may be disposed in the second region 150, but is not limited thereto. In some embodiments, the recess 110 has a first sidewall 120, a second sidewall 122, and a channel 130. The first sidewall 120 is adjacent to the first region 140, the second sidewall 122 is adjacent to the second region 150, and the channel 130 connects the first region 140 to the second region 150. In some embodiments, a width W1 is between the first sidewall 120 and the second sidewall 122 of the recess 110. In some embodiments, a height H1 is between the first sidewall 120 and the second sidewall 122 of the recess 110. In some embodiments, a height difference S1 is between the case 100 positioned in the first region 140 and the recess 110.

Figure 3A:
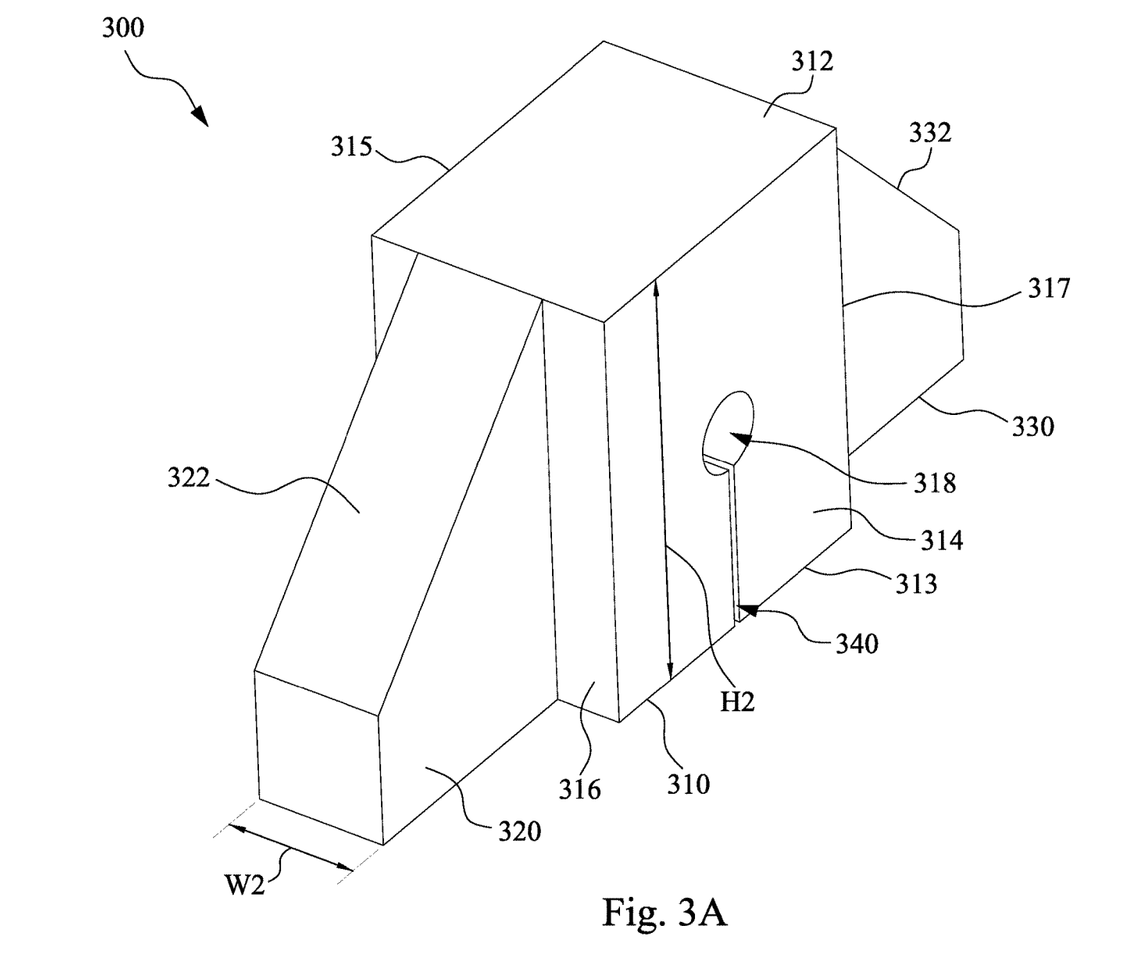
FIG. 3A is a perspective view of an elastic waterproof component in accordance with various embodiments of this invention.
Figure 3B:
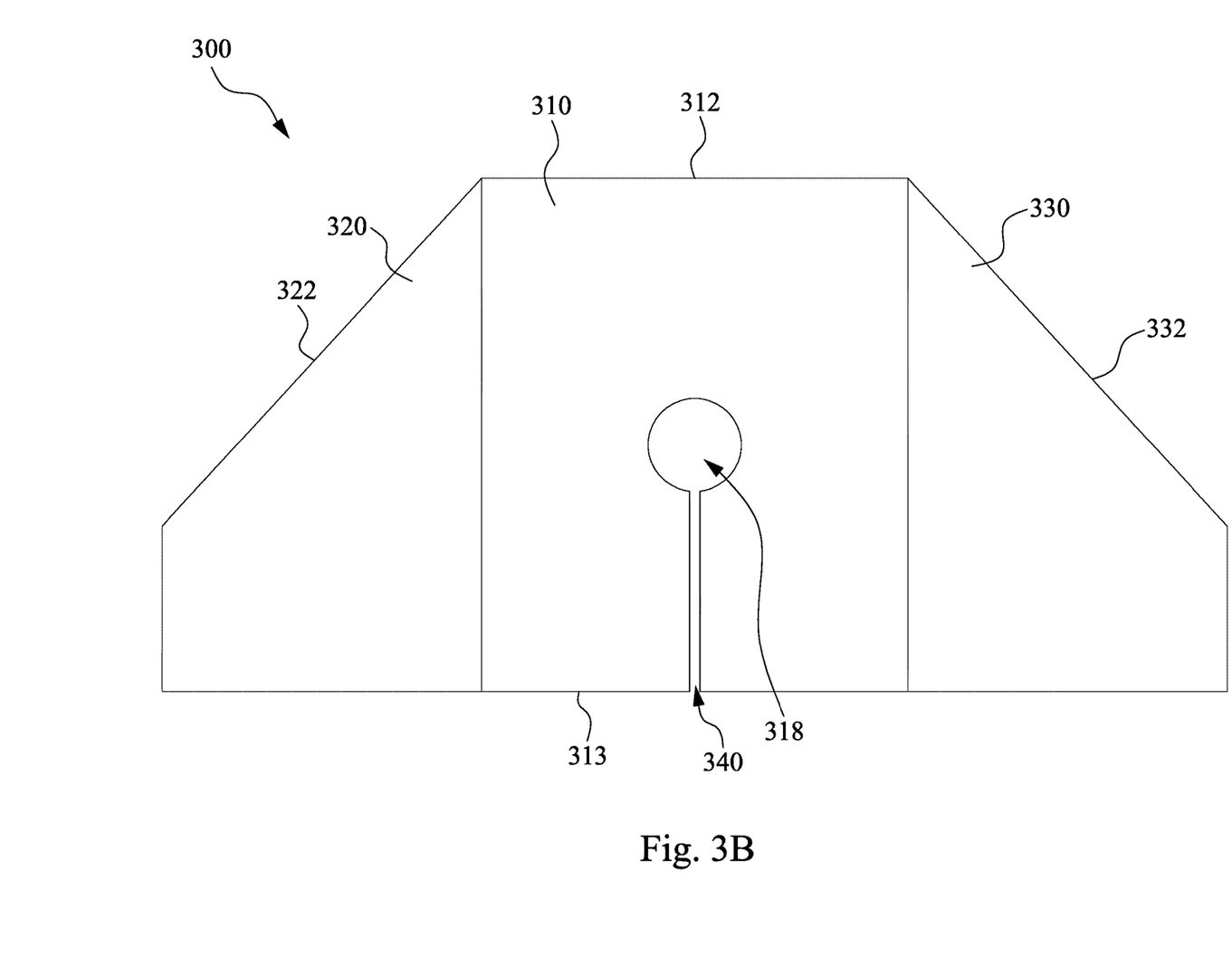
FIG. 3B is a front view of an elastic waterproof component in accordance with various embodiments of this invention.
Figure 3C:
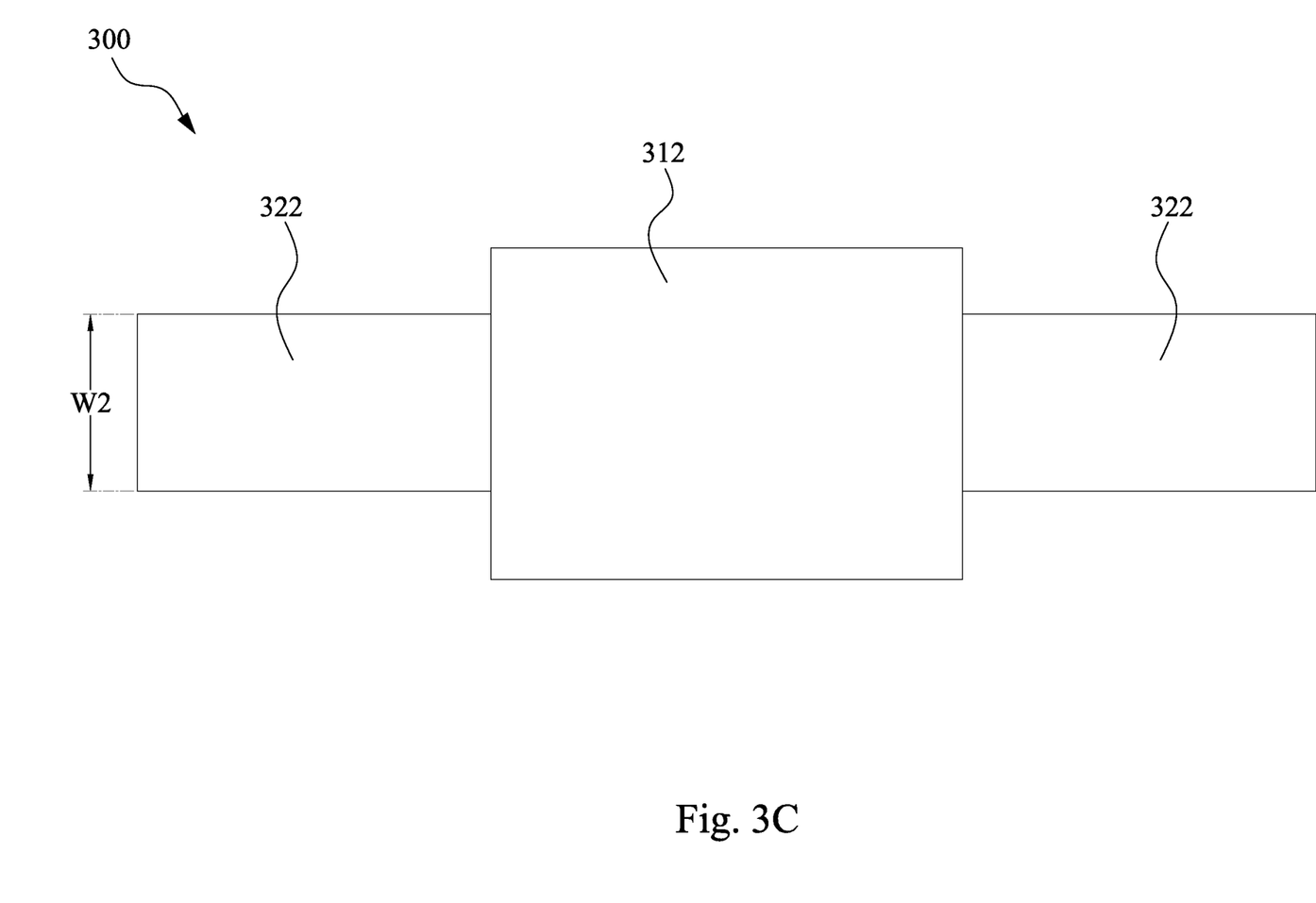
FIG. 3C is a top view of an elastic waterproof component in accordance with various embodiments of this invention.

FIG. 3A, FIG. 3B, and FIG. 3C are respectively a perspective view, front view, and top view of the elastic waterproof component 300 according to various embodiments of the present invention. Please refer to FIGS. 3A-3C. In various embodiments, the elastic waterproof component 300 includes, but is not limited to rubber or silicone. In various embodiments, the elastic waterproof component 300 has a Shore scleroscope hardness of about 45-55. For example, the elastic waterproof component 300 has a Shore scleroscope hardness of 46, 47, 48, 49, 50, 51, 52, 53, or 54. The elastic waterproof component 300 with suitable hardness can be selected according to the materials of the case 100 and the cover 500. As shown in FIGS. 3A-3C, the elastic waterproof component 300 includes a body 310, a first inclined portion 320, and a second inclined portion 330. The body 310 includes a top surface 312, a bottom surface 313, a first side surface 314, a second side surface 315, a third side surface 316, a fourth side surface 317, and a through hole 318. The second side surface 315 is opposite to the first side surface 314, the fourth side surface 317 is opposite to the third side surface 316. The through hole 318 penetrates the body 310 from the first side surface 314 to the second side surface 315, and is configured to accommodate the cable 200 for passing there through. The first inclined portion 320 and the second inclined portion 330 respectively extend from the third side surface 316 and the fourth side surface 317 of the body 310, and have a first inclined surface 322 and a second inclined surface 332. The top surface 312 of the body 310 interconnects the first inclined surface 322 with the second inclined surface 332.

In some embodiments, the elastic waterproof component 300 further includes a slit 340 extending from the bottom surface 313 of the body 310 toward the top surface 312 to the through hole 318. It should be understood that the width of the slit 340 shown in FIG. 3A and FIG. 3B is merely an example, the slit 340 can make the cable 200 enter the through hole 318 easily to assemble with the elastic waterproof component 300. In some embodiments, the body 310 of the elastic waterproof component 300 has a height H2 that is higher than the height H1 of the first sidewall 120 and the second sidewall 122 of the recess 110. In some embodiments, the first inclined portion 320 and the second inclined portion 330 have a width W2 that is greater than the width W1 of the recess 110 (shown in FIG. 2).

Figure 4A:
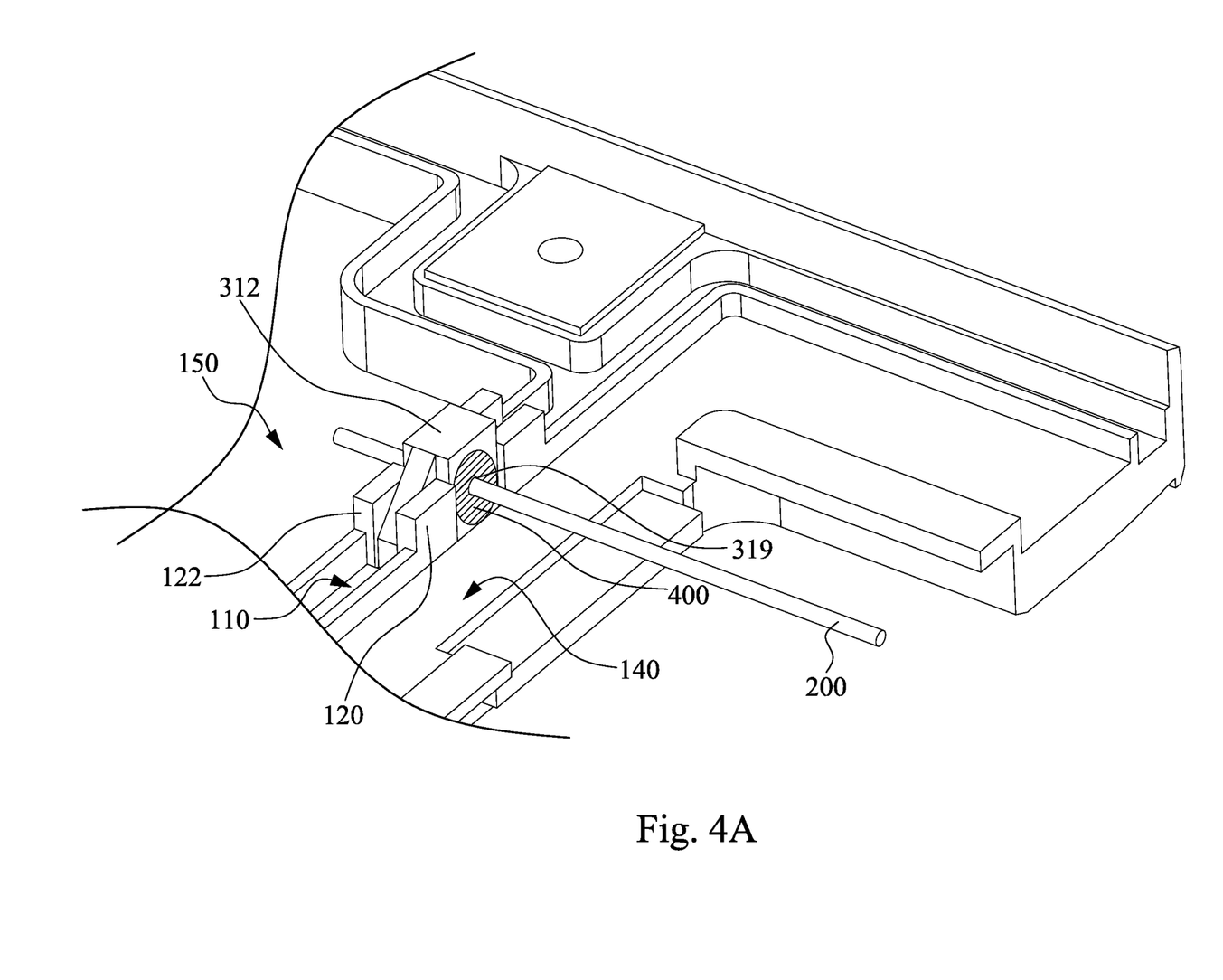
FIG. 4A is a schematic diagram illustrating the assembly of an elastic waterproof component, a cable and a case in accordance with various embodiments of this invention.
Figure 4B:
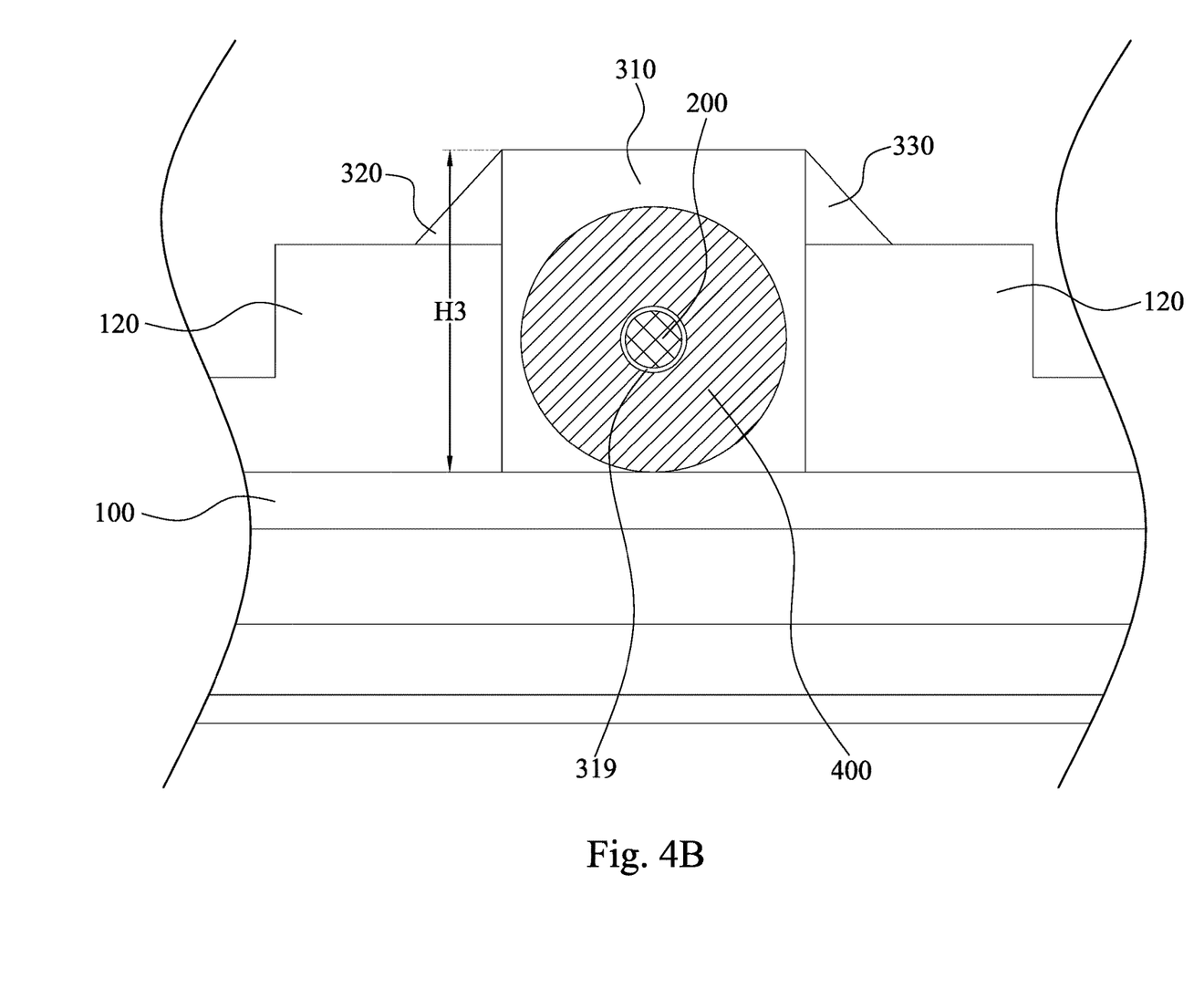
FIG. 4B is a front view of a schematic diagram illustrating the assembly of an elastic waterproof component, a cable and a case in accordance with various embodiments of this invention.

FIG. 4A and FIG. 4B are respectively a perspective view and a front view of a schematic diagram illustrating the assembly of the elastic waterproof component 300, the cable 200 and the case 100 in accordance with various embodiments of this invention. Please refer to FIGS. 4A-4B. The elastic waterproof component 300 is disposed in the recess 110, and the cable 200 penetrates the elastic waterproof component 300 by the through hole 318. The cable 200 can enter the through hole 318 of the elastic waterproof component 300 through the slit 340, and the elastic waterproof component 300 is then embedded in the recess 110. In some embodiments, after the elastic waterproof component 300 is embedded in the recess 110, the slit 340 (shown in FIGS. 3A-3B) is substantially closed. In some embodiments, the body 310 of the elastic waterproof component 300 may be disposed in the channel 130 (shown in FIG. 2) of the recess 110, and the first side surface 314 of the body 310 is exposed to the first region 140, the second side surface 315 is exposed to the second region 350. In some embodiments, the case 100 in the first region 140 has a height difference S1 (shown in FIG. 2) from the recess 110, therefore, after the body 310 of the elastic waterproof component 300 is placed in the recess 110, only the height H3 is exposed to the first region 140 (H3=H2−S1). In some embodiments, the first inclined portion 320 and the second inclined portion 330 of the elastic waterproof component 300 may be disposed between the first sidewall 120 and the second sidewall 122. In some embodiments, the waterproof structure 1000 further includes a waterproof adhesive 400 covering the slit 340 of the first side surface 314 and the edge 319 of the through hole 318. In other embodiments, the waterproof structure 1000 further includes a waterproof adhesive 400 covering the edge of the through hole 318 of the second side surface 315 and the slit 340. It should be understood that the coverage of the waterproof adhesive 400 shown in FIG. 4A and 4B are only examples, the waterproof adhesive 400 needs to cover at least the slit 340 and the edge 319 of the through hole 318, and the waterproof adhesive 400 may cover the entire first side surface 314 and the second side surface 315.

In various embodiments, a first interference is between the elastic waterproof component 300 and the case 100. The first interference is the difference between the size of the elastic waterproof component 300 and the size of the case 100. For example, the first inclined portion 320 or the second inclined portion 330 has the width W2, the recess 110 has the width W1, and the first interference is W2−W1. In some embodiments, the first interference is about 0.1 to about 0.2 mm. By the design of the first interference between the elastic waterproof component 300 and the case 100, and selecting an elastic waterproof component 300 of a suitable hardness, the elastic waterproof component 300 can be tightly engaged with the case 100. A suitable first interference can be designed according to the materials of the case 100 and the elastic waterproof component 300. In one embodiment, the material of the case 100 may be magnesium alloy AZ91, the elastic waterproof component 300 may be silicone having a hardness of about 50, and the first interference may be about 0.1 mm. In other embodiments, when the material of the case 100 is plastic, a large first interference needs to be designed. The reason is that the amount of deformation and tolerance of the plastic is large, and the use of a large amount of interference ensures that the elastic waterproof component 300 and the case 100 can be tightly engaged.

Figure 5:
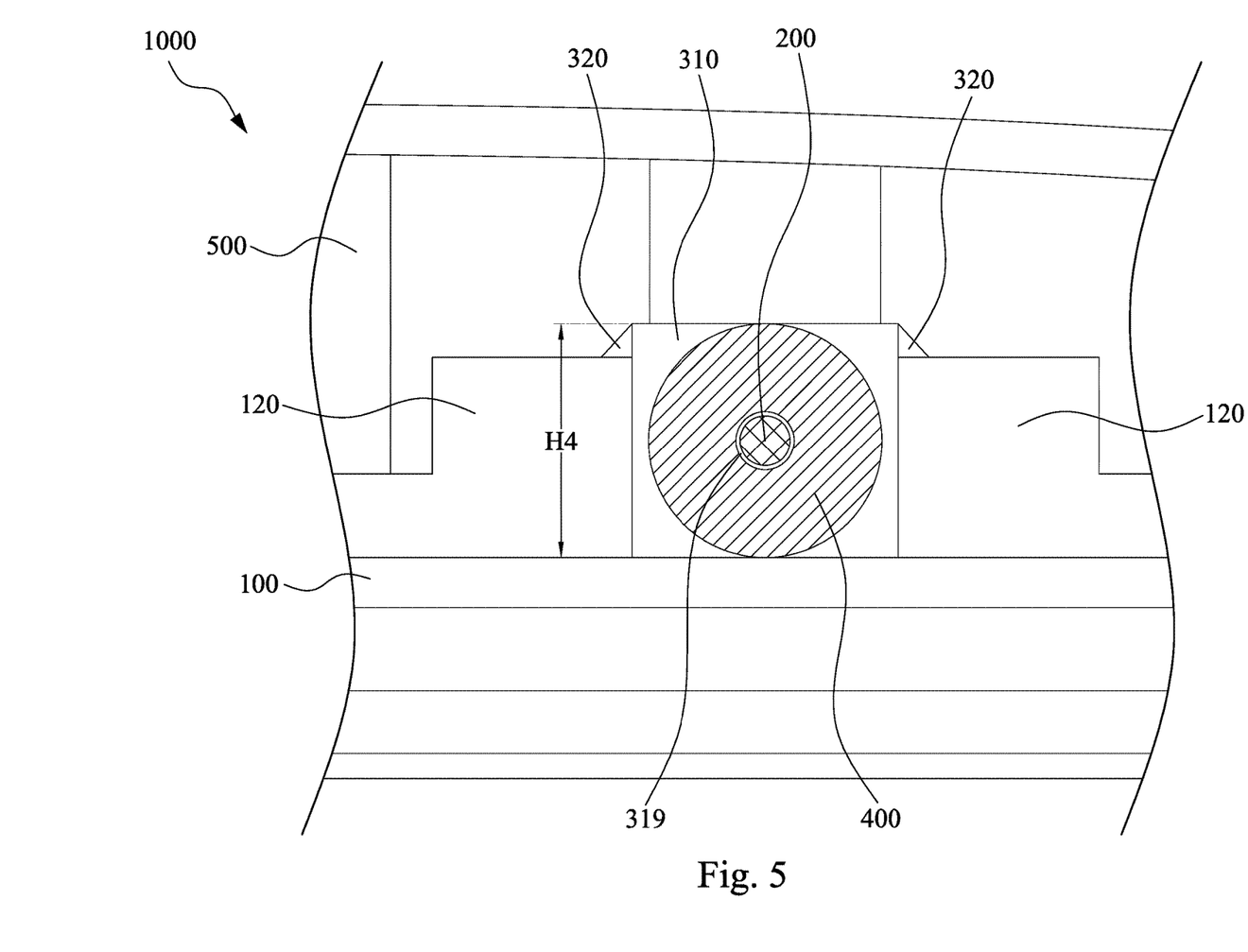
FIG. 5 is a front view of a waterproof structure in accordance with various embodiments of this invention.

FIG. 5 is a front view of a waterproof structure 1000 in accordance with various embodiments of this invention. Please refer to FIG. 5, the cover 500 has a protrusion portion 520 (shown in FIG. 6A) engaged in the recess 110, and the cover 500 covers the elastic waterproof component 300 and the case 100. In various embodiments, the material of the cover 500 includes, but is not limited to plastic or metal alloy. In some embodiments, the material of the cover 500 may be magnesium aluminum alloy. In some embodiments, the material of the cover 500 may be the same as the case 100. In other embodiments, the material of the cover 500 may be different from the case 100. The construction of the cover 500 will be described more clearly in the following description in conjunction with FIGS. 6A and 6B.

Figure 6A:
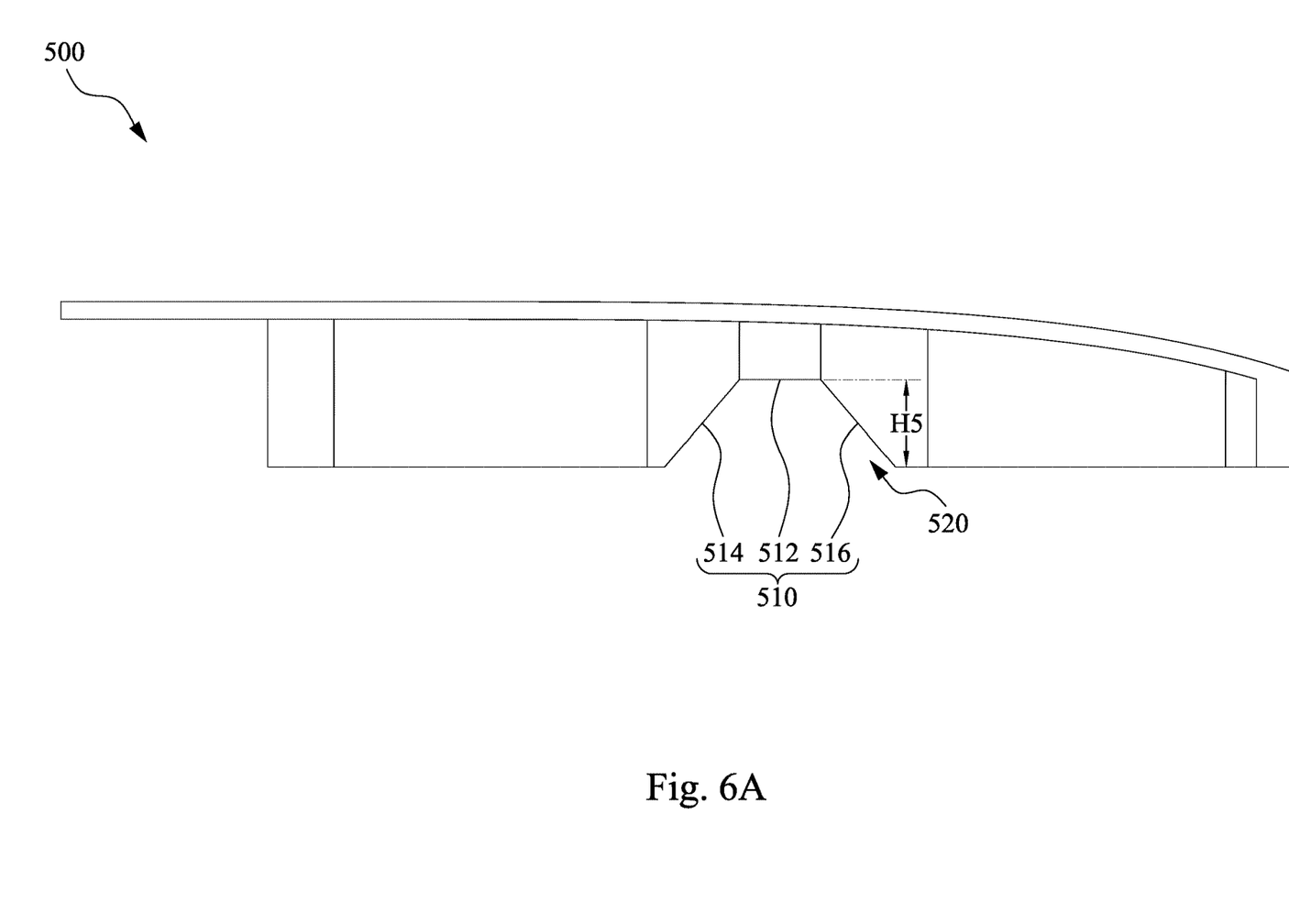
FIG. 6A is a front view of a cover in accordance with various embodiments of this invention.
Figure 6B:
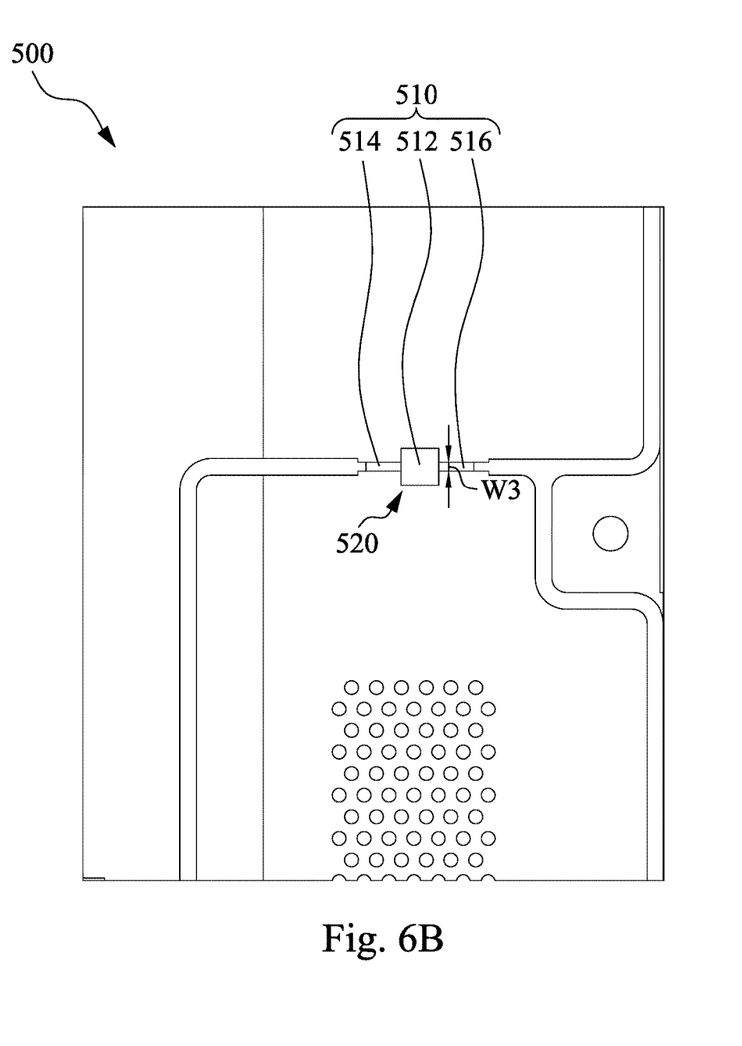
FIG. 6B is a bottom view of a cover in accordance with various embodiments of this invention.

FIG. 6A and FIG. 6B are respectively a front view and a bottom view of the cover 500 in accordance with various embodiments of this invention. In various embodiments, the protrusion portion 520 of the cover 500 has a bottom surface 510, and the bottom surface 510 includes a first surface 512, a second surface 514, and a third surface 516. In some embodiments, the second surface 514 and the third surface 516 are inclined surface, as shown in FIG. 6A. In some embodiments, the second surface 514 and the third surface 516 have a width W3, as shown in FIG. 6B. In some embodiments, the bottom surface 510 of the protrusion portion 520 of the cover 500 contacts the elastic waterproof component 300, and the bottom surface 510 is conformal to the top surface 312, the first inclined surface 322, and the second inclined surface 332 of the elastic waterproof component 300. Please refer to FIG. 3C and FIG. 6B, specifically, the top surface 312, the first inclined surface 322, and the second inclined surface 332 of the elastic waterproof component 300 respectively correspond to the first surface 512, the second surface 514, and the third surface 516 of the protrusion portion 520 of the cover 500. The inclined structures of the elastic waterproof component 300 and the protrusion portion 520 of the cover 500 makes them to be jointed closely, and compared with the upright structure, it is easier to be aligned and not generate a gap when assembled. Therefore, it has better airtightness and a good waterproof effect.

Please refer to FIG. 5. When the protrusion portion 520 of the cover 500 is engaged in the recess 110, the elastic waterproof component 300 may be pressed down by the protrusion portion 520 of the cover 500, since the elastic waterproof component 300 has elasticity. Therefore, the height of the body 310 of the elastic waterproof component 300 exposed to the first region 140 will be reduced. That is, after the protrusion portion 520 of the cover 500 is engaged in the recess 110, the height of the body 310 of the elastic waterproof component 300 exposed to the first region 140 is reduced from height H3 (shown in FIG. 4B) to the height H4 (shown in FIG. 5). In some embodiments, the slit 340 is substantially closed after the protrusion portion 520 of the cover 500 is placed into the recess 110. In various embodiments, a second interference is between the elastic waterproof component 300 and the protrusion portion 520 of the cover 500. The second interference is the difference between the size of the elastic waterproof component 300 and the size of protrusion portion 520 of the cover 500. For example, the first inclined portion 320 or the second inclined portion 330 has the height H2, the second surface 514 and the third surface 516 have the height H5, and the second interference is H2−H5. In some embodiments, the second interference is about 0.4 to about 0.8 mm. For example, the second interference is about 0.5, 0.6, or 0.7 mm. By the design of the second interference between the elastic waterproof component 300 and the cover 500, and selecting an elastic waterproof component 300 of a suitable hardness, the elastic waterproof component 300 can be tightly engaged with the cover 500. It should be noted that the design of the second interference is related to the material of the elastic waterproof component 300 and the cover 500. In one embodiment, the material of the cover 500 may be magnesium alloy AZ91, the elastic waterproof component 300 may be silicone having a hardness of about 50, and the second interference may be about 0.6 mm. In other embodiments, when the material of the cover 500 is plastic, a large second interference needs to be designed. The reason is that the amount of deformation and tolerance of the plastic is large, and the use of a large amount of interference ensures that the elastic waterproof component 300 and the cover 500 can be tightly engaged.

As described above, according to the embodiments of the present invention, providing a waterproof structure. The waterproof structure achieves a waterproof effect by the structure of the case, the elastic waterproof component and the cover, and the design of the interference between the elastic waterproof component and the case, and the interference between the elastic waterproof component and the cover. For example, the above waterproof structure may be disposed around the motherboard to prevent liquid from entering other areas (e.g., speakers) to damage the mother board. Moreover, the waterproof structure of the present invention utilizes the elasticity and the interference amount of the elastic waterproof component to make the case, the elastic waterproof component and the cover be jointed closely. Compared with the traditional method, it is easy to assemble, such that can save manufacturing time and cost, and is also convenient for maintenance.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A waterproof structure comprising:
   a case having a recess defined thereon;
   an elastic waterproof component disposed in the recess, wherein the elastic waterproof component comprises:
      a body comprising a top surface, a bottom surface, a first side surface, a second side surface, a third side surface, and a fourth side surface, the body has a through hole defined thereon, wherein the second side surface is opposite to the first side surface, the fourth side surface is opposite to the third side surface, and the through hole penetrates the body from the first side surface to the second side surface, and is configured to accommodate a cable for passing there through; and
      a first inclined portion and a second inclined portion extending from the third side surface and the fourth side surface respectively, wherein the first inclined portion has a first inclined surface, the second inclined portion has a second inclined surface, and the top surface interconnects the first inclined surface with the second inclined surface; and
   a cover having a protrusion portion corresponding to the recess, the cover is assembled to the case and covers the elastic waterproof component, wherein the protrusion portion presses against the top surface, the first inclined surface and the second inclined surface, so that the case, the elastic waterproof component and the cover are jointed closely.

2. The waterproof structure of claim 1, wherein the case comprises a first sidewall, a second sidewall, the case further defines a first region, a second region, and a channel, wherein the first sidewall is adjacent to the first region, the second sidewall is adjacent to the second region, and the channel communicates the first region with the second region.

3. The waterproof structure of claim 1, wherein the body further comprises a slit extending from the bottom surface of the elastic waterproof component to the through hole.

4. The waterproof structure of claim 3, further comprising a waterproof adhesive covering an edge of the through hole and the slit exposed to the first side surface.

5. The waterproof structure of claim 1, wherein the elastic waterproof component comprises rubber or silicone.

6. The waterproof structure of claim 1, wherein the elastic waterproof component has a Shore scleroscope hardness of about 45-55.

7. The waterproof structure of claim 1, wherein the first inclined portion and the second inclined portion respectively have a width, and the width is greater than a width of the recess.

8. The waterproof structure of claim 1, wherein a first interference between the elastic waterproof component and the case is different from a second interference between the elastic waterproof component and the protrusion portion of the cover.

9. The waterproof structure of claim 8, wherein the first interference is about 0.1 mm to about 0.2 mm.

10. The waterproof structure of claim 8, wherein the second interference is about 0.4 mm to about 0.8 mm.

11. The waterproof structure of claim 1, wherein the case and the cover comprises plastic or metal alloy.

12. The waterproof structure of claim 1, wherein the protrusion portion of the cover has a bottom surface in contact with the elastic waterproof component, and the bottom surface is conformal to the top surface, the first inclined surface and the second surface inclined of the elastic waterproof component.

* * * * *